United States Patent [19]
Bortolini

[11] Patent Number: 5,627,379
[45] Date of Patent: May 6, 1997

[54] DUPLICATION DETECTION OF CIRCUIT BOARD REMOVAL USING TWO LIGHT EMITTING DIODES

[75] Inventor: James R. Bortolini, Broomfield, Colo.

[73] Assignee: Lucent Technologies Inc., Murray Hill, N.J.

[21] Appl. No.: 370,774

[22] Filed: Dec. 23, 1994

[51] Int. Cl.$^6$ .............................. G02B 27/00; H05K 7/14
[52] U.S. Cl. .................... 250/551; 250/229; 250/227.11; 250/222.1
[58] Field of Search .................................... 250/551, 229, 250/222.1, 221, 227.11

[56] References Cited

U.S. PATENT DOCUMENTS

| | | | |
|---|---|---|---|
| 4,593,192 | 6/1986 | Slattery et al. | 250/229 |
| 5,010,450 | 4/1991 | Werdin et al. | 250/551 |
| 5,023,463 | 6/1991 | Boardman et al. | 250/551 |
| 5,142,157 | 8/1992 | Robinson | 250/551 |
| 5,196,712 | 3/1993 | Nguyen et al. | 250/551 |
| 5,202,567 | 4/1993 | Hamanaka | 250/551 |
| 5,268,635 | 12/1993 | Bortolini et al. | 324/96 |

Primary Examiner—Edward P. Westin
Assistant Examiner—John R. Lee
Attorney, Agent, or Firm—John C. Moran

[57] ABSTRACT

Duplicated optical detectors detect the removal of a printed circuit board and are also used as indicators to indicate conditions on the printed circuit board. The detectors comprise a controller, two pairs of light emitting diodes (LEDs), and two light pipes mounted through and secured to a latch handle attached to the printed circuit board. Each light pipe extends over a pair of LEDs in the closed position of the latch handle. One LED of each pair is utilized as a transmitter, and the other LED of the pair is utilized as a light sensor. In the closed position of the latch handle, light is communicated from the transmitter via the light pipe to the light sensor and through the latch handle to the back of the printed circuit board. For purposes of detecting the removal of the board, as the board is being removed, the latch handle pivots away from the board moving the light pipes from the closed position that is over the LEDs. This movement is detected by the controller, since both sensors are no longer detecting light. The controller provides a series of maintenance operations to ascertain that both detectors are working or that there exists one reliable detector still in operation.

5 Claims, 8 Drawing Sheets

DUPLICATION DETECTION OF CIRCUIT BOARD REMOVAL USING TWO LIGHT EMITTING DIODES

TECHNICAL FIELD

This invention relates to detecting the star of printed circuit board removal from a printed circuit board carrier utilizing highly reliable circuitry.

BACKGROUND OF THE INVENTION

High reliability computer systems and telecommunications systems are fully duplicated. Each of these systems has two subsystems each capable of performing the system operations. One subsystem is active performing the operations and is commonly called the active subsystem. The other subsystem is waiting to take over the system operations should the active subsystem fail and is commonly referred to as the standby system. Unfortunately, the standby does not have all of the dynamic data necessary to immediately take ove operations of the system. This data resides on printed circuit boards within the active system. During an unplanned switch from the active subsystem to the standby subsystem, the system operations will not be performed for a period of time. High reliability computeps and telecommunications systems are measured by the projected unavailability. This unavailability is normally measured in minutes per years. An unplanned transfer from the active system to the standby system makes the system unavailable for a period of time and increases the projected unavailability time of the system. The necessity to transfer from the active subsystem to the standby subsystem normally results from a printed circuit board failure within the active system or a programming error. However, another cause is the inadvertent removal of circuit boards from the active subsystem.

The proper procedure to be followed by field technicians when removing a printed circuit board from the active system is to cause the transfer from the active subsystem to the standby subsystem under control of a computer controlling the system. When this computer is aware that the transfer is going to take place, the computer executes procedures such that the system is continuously available during the transfer of control from the active subsystem to the standby subsystem. Unfortunately, field technicians do fail to follow the proper procedures and mistakely remove circuit boards from active subsystems.

U.S. Pat. No. 5,196,712 provides a partial solution for detecting the removal of a circuit board. However, the apparatus disclosed in that U.S. patent is implemented using a mechanical switch which requires that the printed circuit board's latch handle have a plate that inserts into an optical housing mounted on the circuit board. The disclosed technique does not lend itself to modem circuit board manufacturing techniques such as surface mount technology. The housing of necessity must protrude a significant distance above the surface of the circuit board causing two problems. The first problem is that it lowers the number of printed circuit boards that can be inserted into a printed circuit board carrier. The second problem is that because of the bulk of the housing, it cannot be mounted on the printed circuit board using surface mount technology. Another problem with the disclosed technique is that it is vulnerable to false indications that the circuit board is being removed. These false indications are due to the fact that the proposed technique utilizes circuitry in which a single failure can falsely indicate that the circuit board is being removed.

Another problem with the method set forth in U.S. Pat. No. 5,196,712 is that the rear portion of a circuit board is densely populated with a variety of integrated circuits, test jacks, and LED indicators. The above referenced patent compounds this problem since it utilizes a great deal of circuit board area. In addition, LED indicators, where the LED must be mounted in a plane horizontal to the circuit board, cannot be manufactured using surface mount technology. In addition, mounting LEDs in this manner results in lower reliability than if the LEDs are mounted utilizing surface mount technology.

SUMMARY OF THE INVENTION

The aforementioned problems are solved and a technical advance is achieved in the art by the use of duplicated optical detectors to detect the removal of a printed circuit board and as indicators to indicate conditions on the printed circuit board. The detectors comprise a controller, two pairs of light emitting diodes (LEDs), and two light pipes mounted through and secured to a latch handle attached to the printed circuit board. Each light pipe extends over a pair of LEDs in the closed position of the latch handle. One LED of each pair is utilized as a transmitter, and the other LED of the pair is utilized as a light sensor. In the closed position of the latch handle, light is communicated from the transmitter via the light pipe to the light sensor and through the latch handle to the back of the printed circuit board. For purposes of detecting the removal of the board, as the board is being removed, the latch handle pivots away from the board moving the light pipes from the closed position that is over the LEDs. This movement is detected by the controller, since both sensors are no longer detecting light. Advantageously, the controller provides a series of maintenance operations to ascertain that both detectors are working or that there exists one reliable detector still in operation.

DETAILED DESCRIPTION

Figure 1:
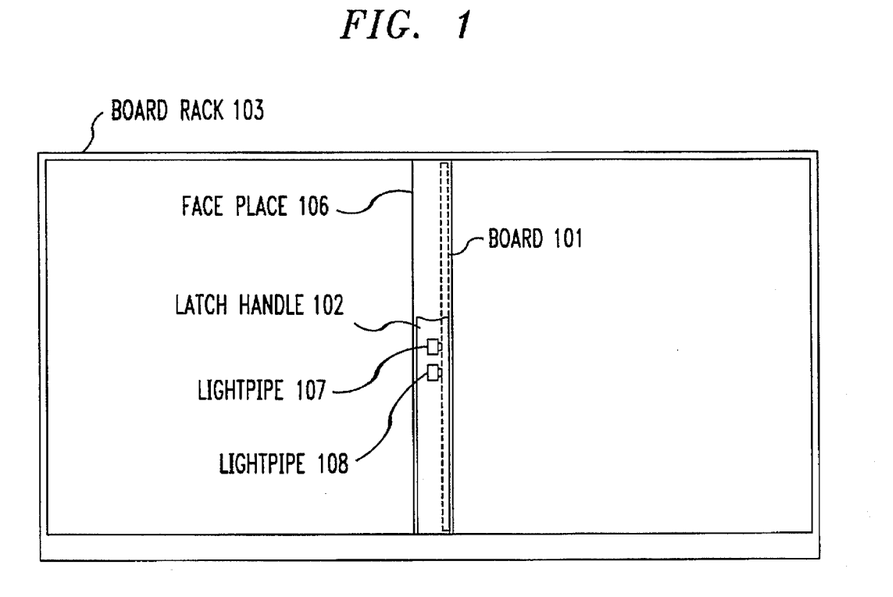
FIG. 1 illustrates a front view of a circuit board inserted into a board rack.
Figure 2:
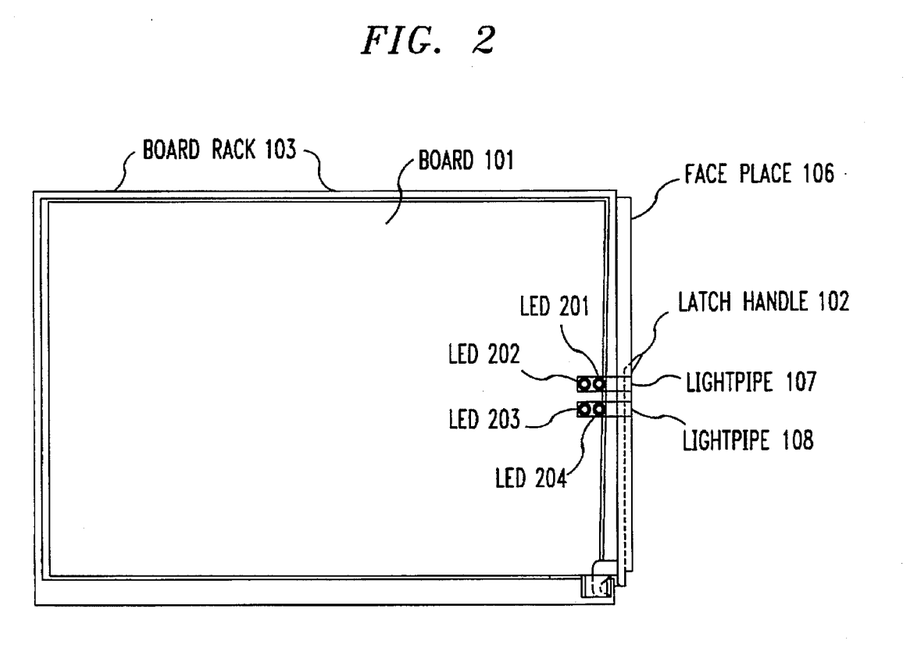
FIG. 2 illustrates a side view of the board rack and the inserted board.
Figure 3:
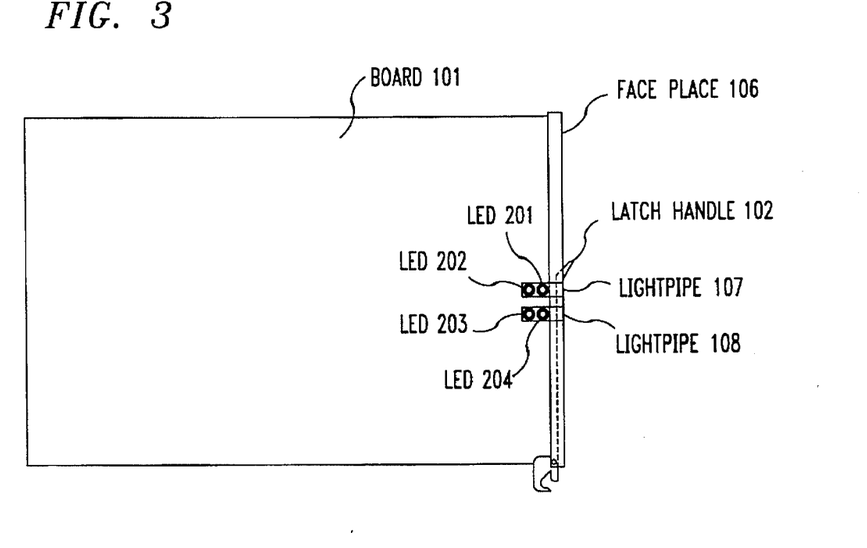
FIG. 3 illustrates a side view of the circuit board which highlights the detectors mounted on the board in relationship to the light pipes mounted on the latch handle when latch handle is closed.
Figure 4:
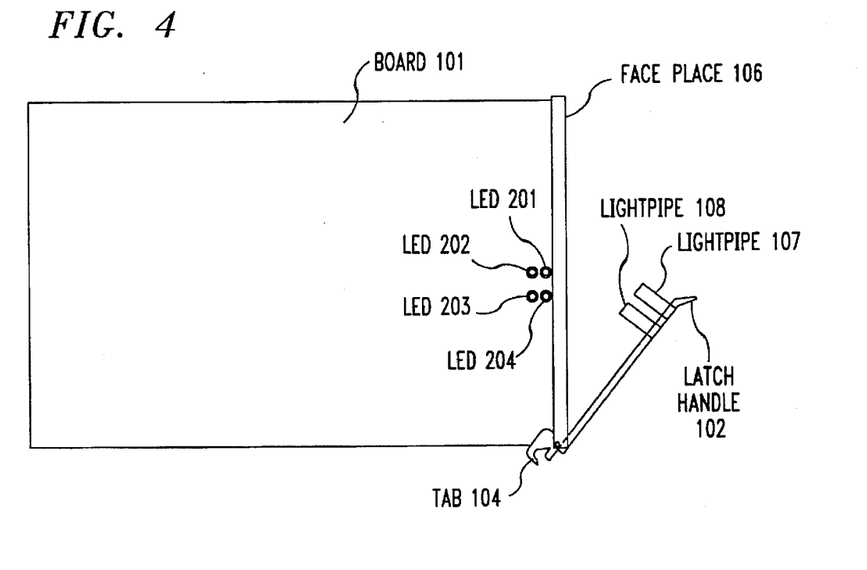
FIG. 4 illustrates a side view of the circuit board with the latch handle open.
Figure 5:
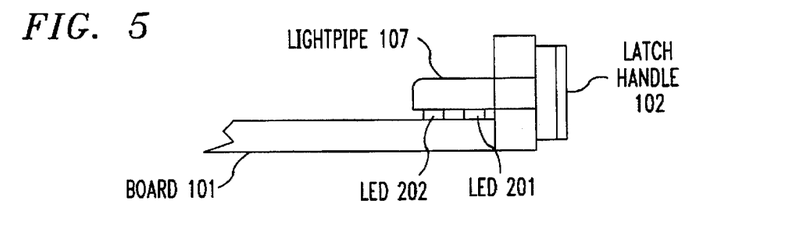
FIG. 5 illustrates an expanded top view of a light pipe and LEDs.

FIGS. 1 and 2 illustrate the front and side views, respectively, of board 101 inserted into board rack 103. As can be seen from FIG. 2, when it is desired to remove board 101, latch handle 102 is pivoted away from board 101. Tab 104 exerts pressure on board rack 103 causing the board to be extracted. As latch handle 102 is pivoted outward (open position), light pipes 107 and 108 no longer are positioned over LEDs 201 and 202 and LEDs 203 and 204, respectively, as illustrated in FIG. 4. FIG. 3 illustrates the position of the light pipes in relation to the LED pairs when latch handle 102 is in the closed position. When latch handle 102 is in the closed position as illustrated in FIG. 3, if either LED 201 or 202 is emitting light, this light is transmitted through light pipe 107 to the outer edge of latch handle 102 and can be utilized as an indication of some condition on board 101. When LEDs 201 and 202 are also being used as a detector to detect whether latch handle 102 is in the open position, LED 201 is emitting light and that light not only is transmitted by light pipe 107 to the back of latch handle 102 but a portion of the emitted light is refracted or reflected into LED 202 from light pipe 107. In the detection function, LED 202 is utilized as a light sensor as will be described later in greater detail. FIG. 5 illustrates an expanded view of the relationship of light pipe 107 to LEDs 201 and 202. The LEDs are mounted on board 101 using surface mount technology.

When the indicator function of a pair of LEDs dictates that the emitting LED be turned off, the detector function is performed by flashing the emitting LED at a rate such that the emitted light is not perceptible by the human eye. The LED utilized to sense light then is interrogated only while the emitted LED is turned on during the flash time.

Figure 7:
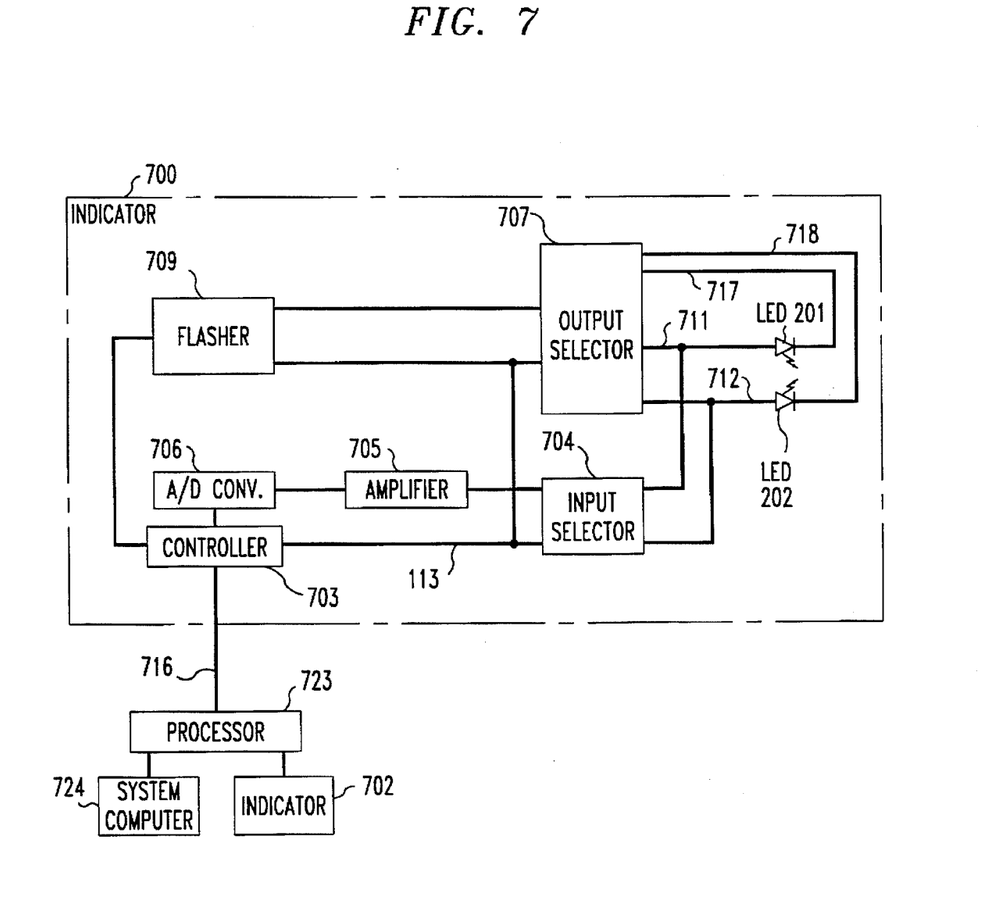
FIG. 7 illustrates a block diagram of the system computer, processor, and detectors.

With respect to the detection function, there are two detectors. Detector 1 utilizes light pipe 107, LED 201, and LED 202. Detector 2 utilizes light pipe 108, LED 203, and LED 204. FIG. 7 illustrates the circuits in a first embodiment that are utilized with respect to the two pairs of LEDs that form the indicators and the LED portion of the detectors. Processor 723 communicates major and minor alarms concerning the detection function to system computer 724. System computer 724 transmits to processor 723 messages determining whether indicators 700 or 702 should be turned on or off.

As illustrated in FIG. 7, indicator 700 is controlled by controller 703 which communicates with processor 723 over bus 716. When controller 703 receives a message from processor 723 dictating that indicator 700 is to be turned on, controller 703 controls flasher 709 so that LED 201 is permanently turned on via output selector 707. With latch handle 102 in the closed position, a portion of the light emitted by LED 201 is transferred via light pipe 107 to LED 202. When used as a light sensor, the output of LED 202 is read by controller 703 via elements 704, 705, and 706. As will be explained later with respect to FIG. 6, if it is determined that LED 201 is not emitting light when latch handle 102 is in the closed position, processor 723 instructs controller 703 to turn on both LEDs 201 and 202 for the indicator function. When this occurs, the detection function can only be performed by indicator 702 in conjunction with light pipe 108.

Figure 6:
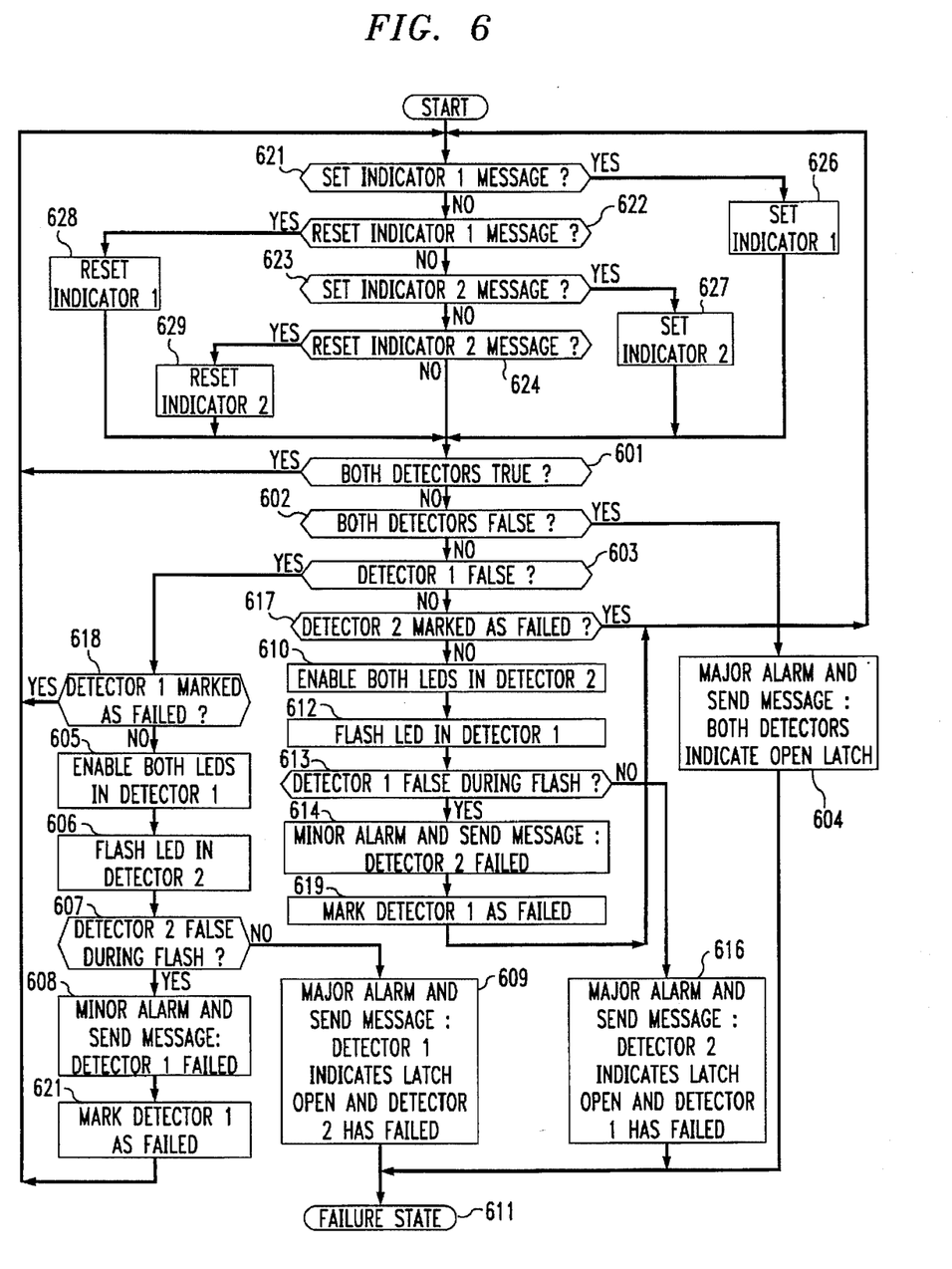
FIG. 6 illustrates, in flow chart form, the operations performed by a processor that controls the detection of board removal.

FIG. 6 illustrates the functions performed by processor 723 for both the detection and indication functions. First, decision block 621 determines if a "set indicator 1", indicator 700 of FIG. 7, message has been received from system computer 724. If the answer is yes, block 626 causes a message to be transmitted to controller 703 to turn on indicator 700. After execution of block 626, control is transferred to decision block 601. If the answer in decision block 621 is no, decision block 622 determines whether a message to "reset indicator 1" was received. If the answer is yes, block 628 is executed to reset indicator 1 and to transfer control to decision block 601. If the answer in decision block 622 is no, control is transferred to decision block 623 which determines if a "set indicator 2" message was received from system computer 724. If the answer is yes, block 627 is executed to set indicator 2 and to transfer control to decision block 601. If the answer in decision block 623 is no, control is transferred to decision block 624. The latter decision block determines if a "reset indicator 2" message was received from system computer 724. If the answer is yes, control is transferred to block 629 which resets indicator 2 and transfers control to decision block 601. If the answer in decision block 624 is no, control is transferred to decision block 601.

Decision block 601 determines whether both detectors are indicating a true condition, in other words the latch handle is detected as being closed. If the answer is yes, control is transferred back to decision block 621. If the answer in decision block 601 is no, control is transferred to decision block 602 which determines if both detectors are indicating that the latch handle is in the open position which results in a false signal. If the answer is yes, control is transferred to block 604 which transmits a major alarm and the message "both detectors indicate open latch" to system computer 724. After execution of block 604, control is transferred to block 611 which places processor 723 in the failure state. System computer 724 can force processor 723 out of the failure state and to reexecute decision block 621. Returning to decision block 602, if the answer is no, control is transferred to decision block 603 which determines if detector 1 is transmitting a false signal.

If the answer in decision block 603 is false, control is transferred to decision block 618 which checks if detector 1 has been marked as having failed. Detector 1 would have been marked as having failed if it had been detected as failed in a previous execution of blocks 618, 605–608, and 621. If detector 1 is marked as failed, control is transferred back to decision block 621. If the answer in decision block 618 is no, block 605 is executed. The latter block transmits a command to controller 703. Controller 703 is responsive to the command to turn on both LEDs 201 and 202 upon receiving a command from processor 723 to set indicator 700. This is done because it assumes that LED 201 has failed, and an attempt is made to still be able to utilize indicator 700 for its indicating function.

After execution of block 605, block 606 flashes the emitting LED in detector 2 off, and decision block 607 determines whether detector 2 is false during the emitting LED being flashed off. If the answer is yes, this indicates that the LEDs in detector 2 are functioning properly and control is transferred to block 608. The latter block sends a minor alarm and the message "detector 1 has failed" to system computer 724. Next, block 621 is executed to mark detector 1 as having failed, and then control is transferred back to decision block 621. Returning to decision block 607, if the answer is no, detector 2 is assumed as having failed, and detector 1 is assumed to be operating correctly. Control is transferred to block 609 which transmits a major alarm and the message "detector 1 indicates the latch is open and detector 2 has failed". After execution of block 609, control is transferred to block 611.

Returning to decision block 603, if the answer is no, this means that detector 2 is indicating that the latch handle is in the open position. Control is transferred to blocks 617, 610–616, and 619. These blocks perform similar functions with respect to detector 2 as were described in the previous paragraphs with respect to detector 1.

Figure 8:
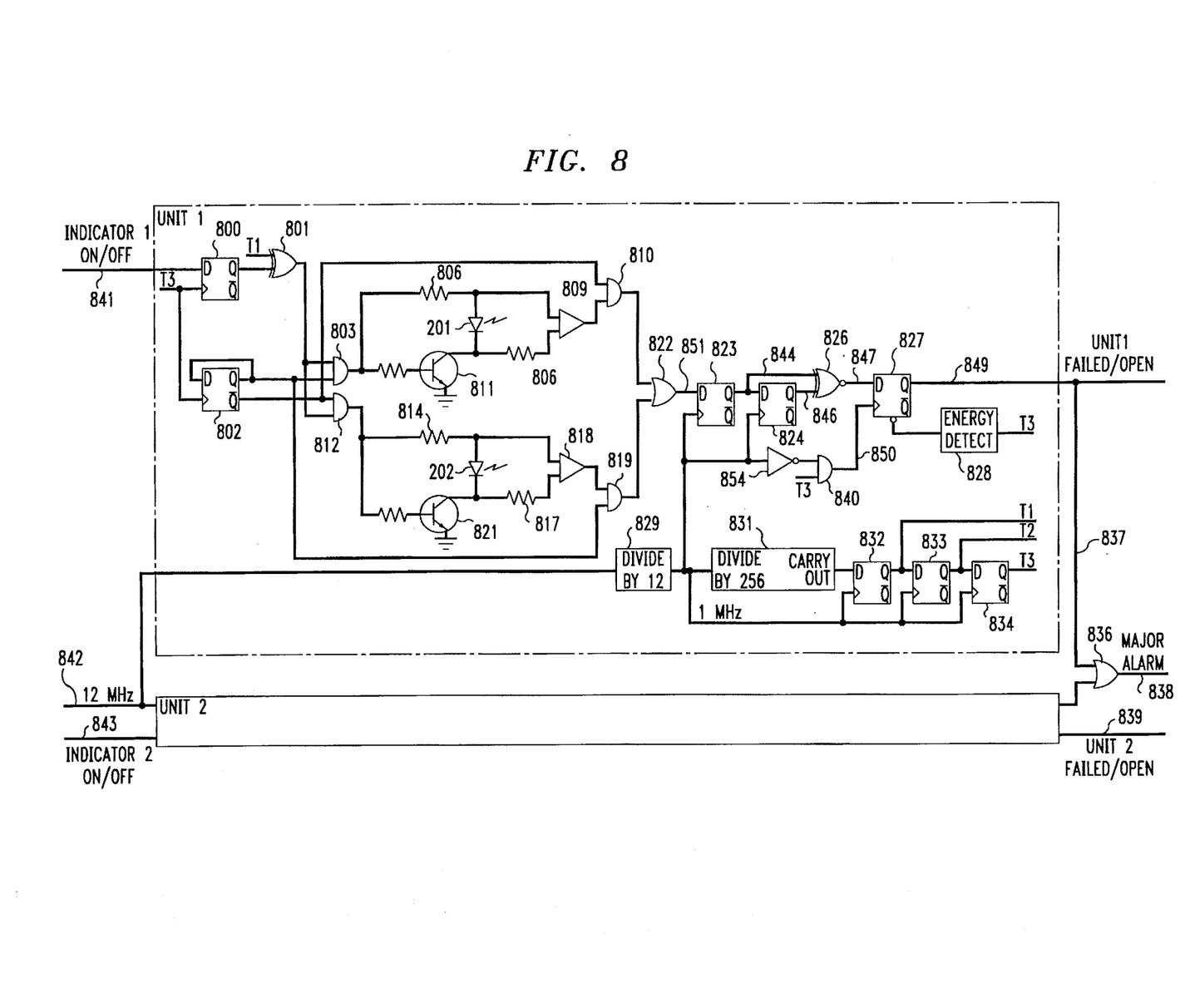
FIG. 8 illustrates a second embodiment of the inventive concept.

A second embodiment of the invention is illustrated in FIG. 8. FIG. 8 illustrates units 1 and 2 with each unit providing the indicating and the detecting functions. The system computer controlling the switching system communicates with these two units via conductors 837–843. Unit 1 is shown in detail, and unit 2 is identical in design. If one of the units fails or detects that the latch handle is open, a major alarm is transmitted to the system computer via conductor 838 and either conductor 837 or 839 designates what unit had failed or determined that the latch handle is open.

Figure 9:
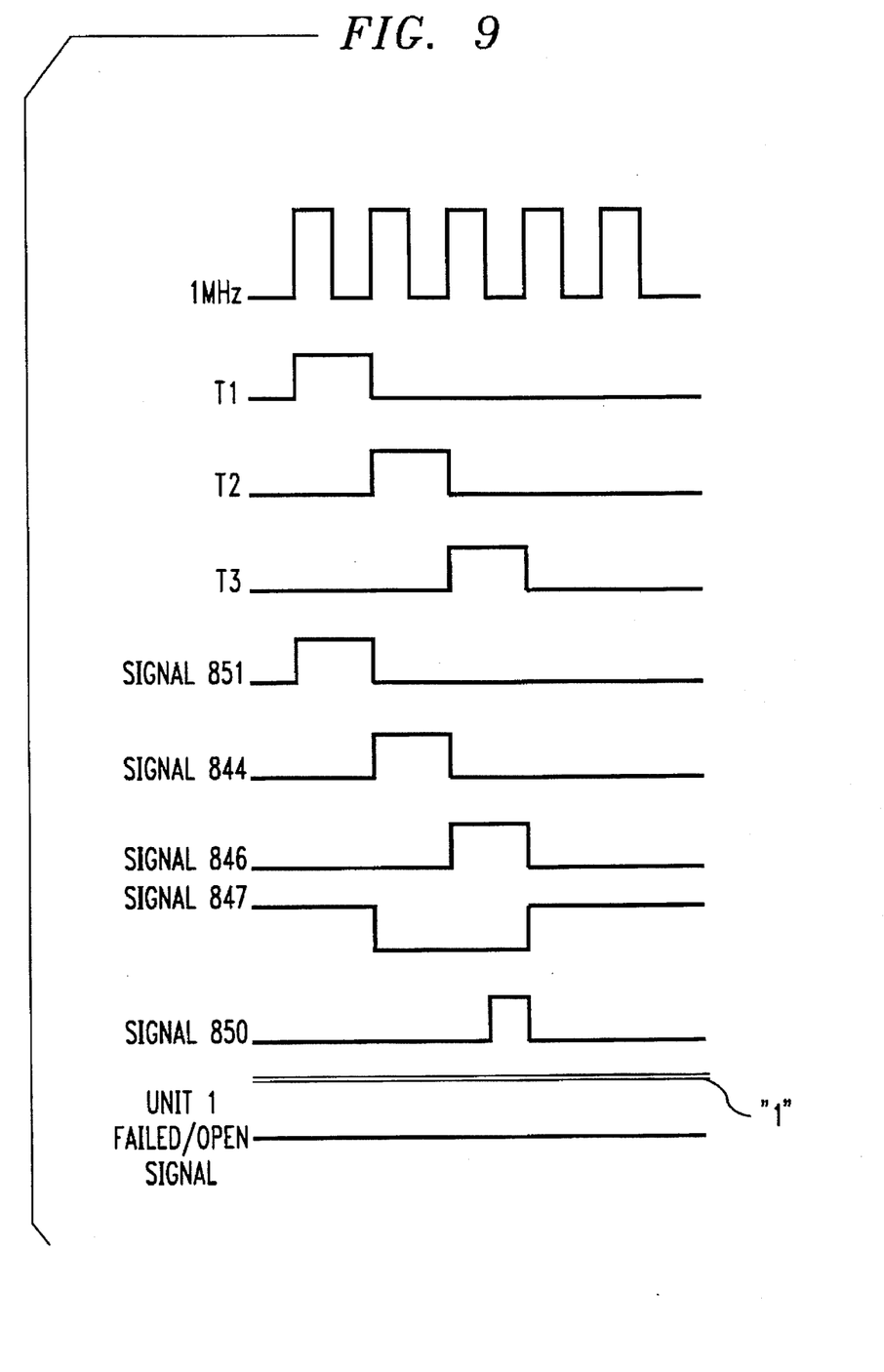
FIGS. 9, 10 and 11 illustrates timing diagrams for the second embodiment.

Consider now in detail the operation of unit 1. First consider the example where the system computer has turned off the indicating function provided by unit 1. The system computer does this by transmitting a "1" also referred to as a "high", to unit 1 via conductor 841. This signal is clocked into flip flop 800 by the T3 signal. The timing for this example is illustrated in FIG. 9. The 12 MHz received from either the system computer or other subsystems, is divided by 12 by frequency divider 829 to produce the 1 MHz signal. Elements 831–834 are responsive to the 1 MHz signal to generate clock signals T1, T2, and T3. These signals are only generated once for every 255 pulses of the 1 MHz signal. Unit 1 controls and senses LEDs 201 and 202 by two identical circuits.

The circuit for controlling and sensing LED 201 comprises elements 803–811, and the circuit for controlling and sensing LED 202 comprises elements 812–821. Flip flop 802 reverses the role played by these two circuits upon each occurrence of the T3 signal. Hence, during one period of time, LED 201 performs the role of the indicating or emitting LED and LED 202 is utilized to sense the output of LED 201. In the next period of time, the LED s switch functions. In the present example, the system computer has turned off the indicating function of unit 1. The output of flip flop 800 is transmitted to Exclusive OR 801. Since flip flop 800 is transmitting a "0" to Exclusive OR 801, the output of Exclusive OR 801 will only be at a "1" state during the T1 signal being at a "1". Assume that flip flop 802 is in the set state and is transmitting a "1" to AND gate 803. During the "1" state of signal T1, AND gate 803 transmits a "1" from its output to transistor 811 and resistor 806. Transistor 811 is turned on and the current received from AND gate 803 via resistor 806 turns LED 201 on. Whether LED 201 is emitting light or not is detected by the circuit elements interconnected to LED 202, since the Q̄ of flip flop 802 is transmitting a "0" to AND gate 812. This "0" causes the output of AND gate 812 to be a "0" which does not turn on LED 202 and transistor 821. Amplifier 818 senses whether LED 202 is detecting emitted light from LED 201. If LED 201 is not emitting light or the latch handle is open, amplifier 818 detects no light. Assuming that amplifier 818 does detect light, AND gate 819 transmits a "1" to OR gate 822. In response to this "1", OR gate 822 transmits signal 851, a "1", as illustrated in FIG. 9. On the next rising edge of the 1 MHz signal, the "1" from OR gate 822 is clocked into flip flop 823 producing signal 844 as illustrated in FIG. 9. On the subsequent rising edge of the 1 MHz signal, the set state of flip flop 823 is transferred to 824 and flip flop 823 is reset. Signals 844 and 846 are transmitted to Exclusive NOR gate 126 which generates signal 847 as illustrated in FIG. 9. The signal 847, "0", is clocked into flip flop 827 by signal 850 which is generated by elements 840 and 854 in response to the 1 MHz and T3 signals. The output flip flop 827, a "0", is transmitted as the Unit 1 failed/open signal. Since unit 1 is able to generate and detect light, the signal transmitted to the system computer on conductor 837 is a "0" and no major alarm signal is transmitted on conductor 838.

Figure 10:
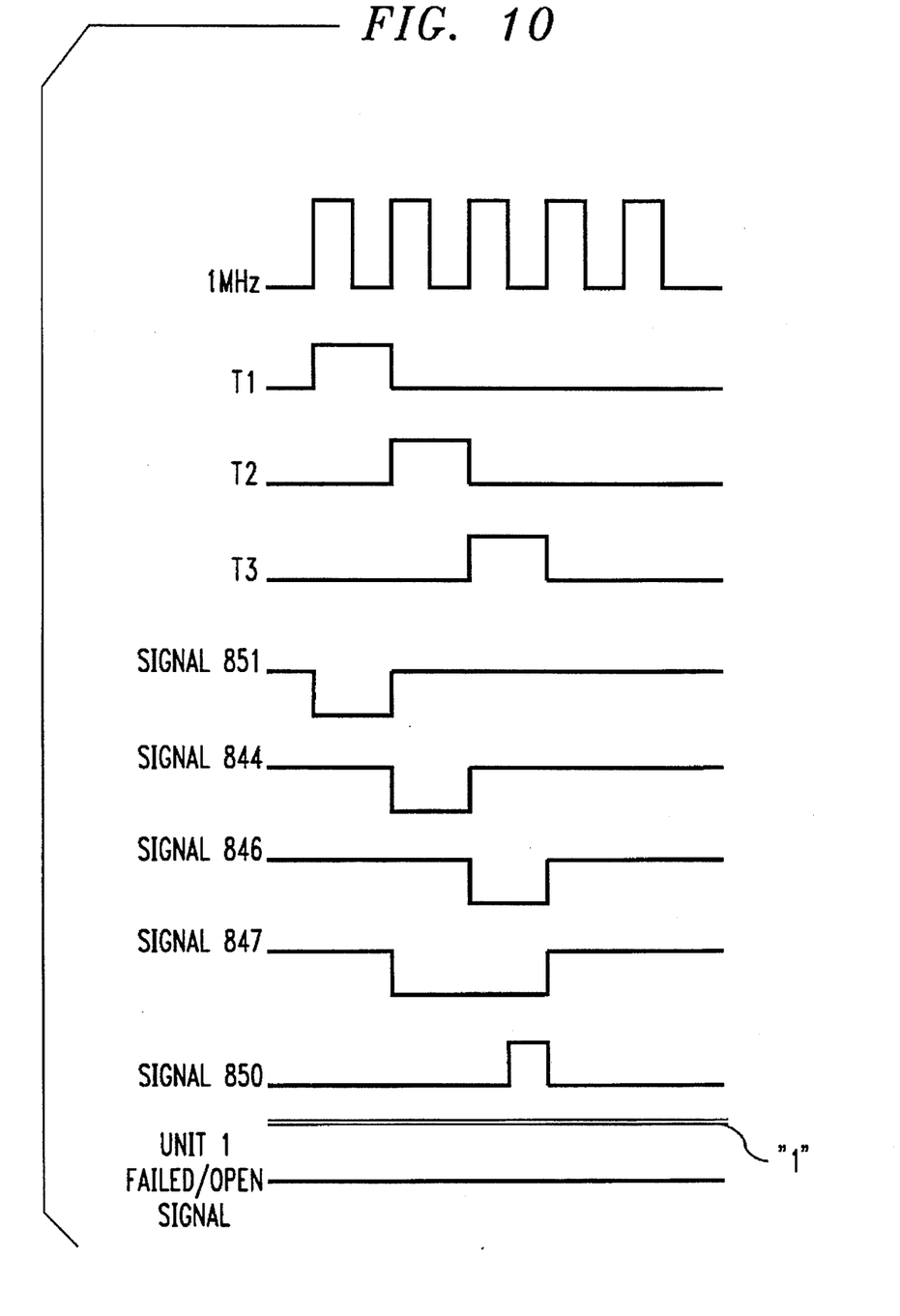

Consider now the example where the system computer has turned the indicating function of unit 1 on via conductor 841 causing flip flop 800 to be set. Until the T1 signal goes to the "1" state, Exclusive OR 801 transmits a "1" to AND gates 803 and 812. Whichever LED is being utilized at a particular point in time for the indicator function is turned on by flip flop 802 transmitting a "1" to either AND gate 803 or 812. Consequently, the LED that is being utilized to sense the light has its AND gate, AND gate 810 or 819, enabled. If the light is being sensed, a "1" is transmitted to OR gate 822 which transmits signal 851 as illustrated on FIG. 10. Once T1 goes to the "1" state, the output of Exclusive OR gate 801 is forced to a "0" which results in the output of OR gate 822 producing a low as illustrated by the signal 851 in FIG. 10. Signal 851 is then clocked into flip flops 823 and 824 to produce signals 844 and 846. These signals are transmitted to Exclusive NOR gate 826 which produces signal 847, a "0", as illustrated in FIG. 10. Signal 847 is clocked into flip flop 827 by signal 850. This results in a "0" being clocked into flip flop 827. Hence, no major alarm is transmitted to the system computer via conductor 838; nor, does conductor 837 indicate that unit 1 has failed or detected an open latch handle.

Figure 11:
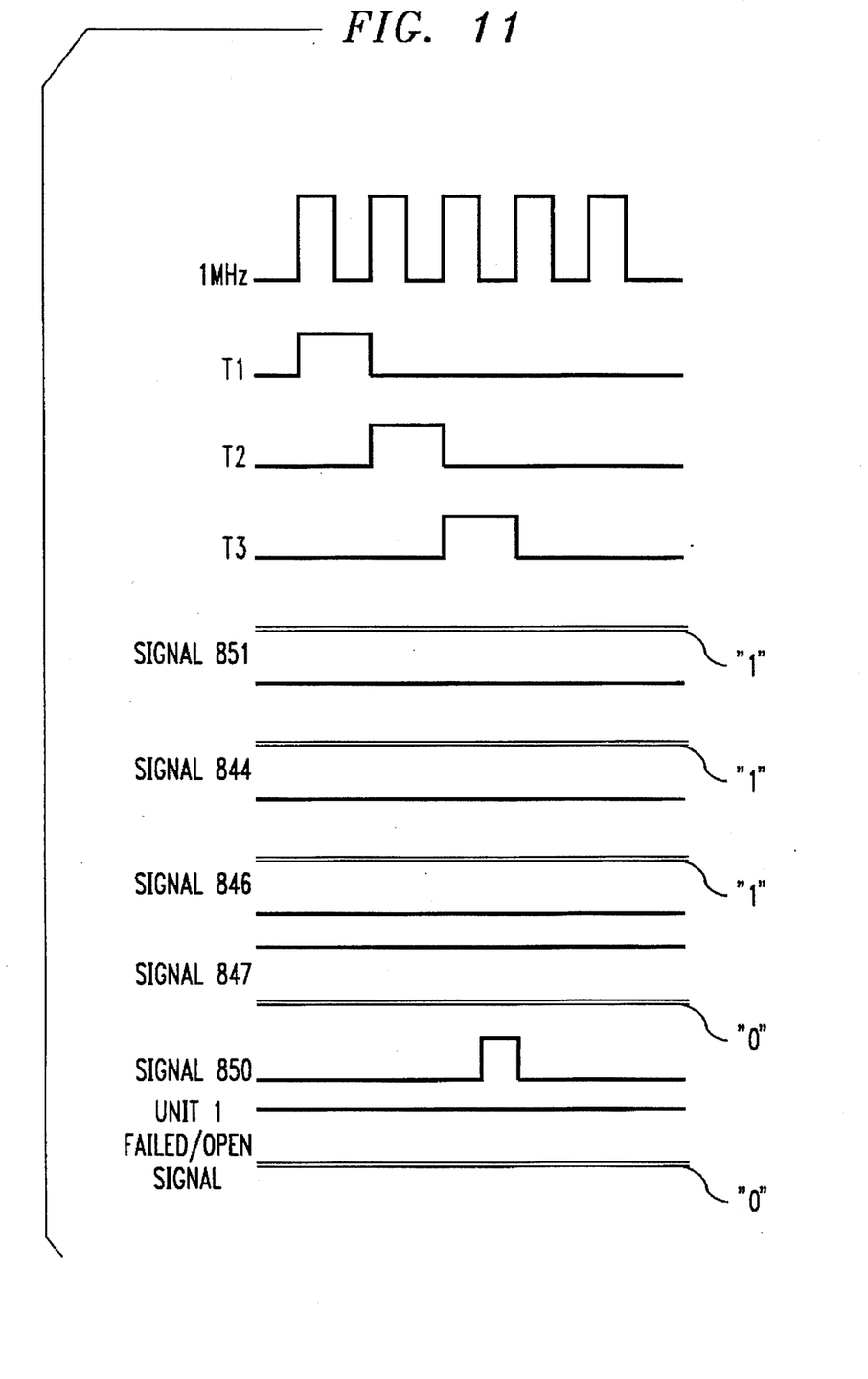

Consider the example now illustrated in FIG. 11 where the latch handle is open or one of the LEDs is failing to emit or detect light. When this occurs, AND gates 810 and 819 transmit a continuous "0" to OR gate 822. In response, OR gate 822 transmits a "0" for signal 851. This is continuously clocked into flip flops 824 and 827. This is true since the latchs handle is open or an LED has failed, the T1 signal has no effect on the "0" that is being transmitted from both AND gates 810 and 819. Exclusive NOR gate 826 is responsive to the low signals being received to generate a "1" that is clocked into flip flop 827 by signal 850. Flip flop 827 transmits a "1" on conductor 837 resulting in a major alarm signal being transmitted on conductor 838 and the unit 1 failed/open signal being transmitted on conductor 837.

To assure the integrity of the timing being generated by elements 831–834, energy detect circuit 828 detects when the T3 signal is no longer being generated and forces the output of flip flop 827 to generate a "1" on conductor 837.

It is to be understood that the above-described embodiments are merely illustrative of the principals of the invention and that other arrangement may be devised by those skilled in the art without departing from the spirit and scope of the invention.

I claim:

1. An apparatus for detecting print circuit board removal and providing a state indication, comprising:
   a first pair of light emitting diodes having a first and second light emitting diode mounted on a print circuit board;
   a latch handle mounted on the print circuit board;
   a first light pipe mounted on and projecting through the latch handle such that in a locked position of the latch handle the first light pipe covers the first pair of light emitting diodes wherein light generated from first light emitting diode of the first pair is communicated through the first light pipe to the second light emitting diode of the first pair and though an opening in the latch handle;
   with the latch handle in an unlocked position, the first light pipe no longer covers both of the light emitting diodes of the first pair and the unlocked position indicates that the print circuit board is being removed;
   a controller responsive to a first signal to turn on a first indicator turns on the first light emitting diode of the first pair and responsive to a second signal to turn off the first indicator turns off the first light emitting diode of the first pair;

the controller detects if light is being received by the second light emitting diode of the first pair when the first indicator is turned on and signals printed circuit board removal upon no light being detected; and the controller flashes on the first light emitting diode of the first pair while the first indicator is turned off, detects if light is being received by the second light emitting diode of the first pair during the flash, and signals printed circuit board removal upon no light being detected during the flash.

2. The apparatus of claim 1 further comprises a second pair of light emitting diodes having a first and second light emitting diode and a second light pipe with the second light pipe positioned with respect to the second pair of light emitting diodes and the latch handle in the same manner as the first light pipe is positioned with respect to the first pair of light emitting diodes and the latch handle;

a controller responsive to a third signal to turn on a second indicator turns on the first light emitting diode of the second pair and responsive to a fourth signal to turn off the second indicator turns off the first light emitting diode of the second pair;

the controller detects if light is being received by the second light emitting diode of the second pair when the second indicator is turned on and signals printed circuit board removal upon no light being detected by the second light emitting diode of the second pair and that printed circuit board removal is being detected from the first pair light emitting diodes; and the controller flashes on the first light emitting diode of the second pair while second indicator is turned off, detects if light is being received by the second light emitting diode of the second pair during the flash, and signals printed circuit board removal upon no light being detected during the flash and that printed circuit board removal is being detected from the first pair of light emitting diodes.

3. The apparatus of claim 2 wherein the controller at a predefined interval reverses the function of the light emitting diodes in both the first and second pairs of light emitting diodes 4. The apparatus of claim 3 wherein the controller flashes the first light emitting diode of the first pair off while the first indicator is turned on at predefined intervals to test that the second light emitting diode of the first pair is detecting light.

5. The apparatus of claim 4 wherein the controller flashes the first light emitting diode of the second pair off while the second indicator is turned on at predefined intervals to test that the second light emitting diode of the second pair is detecting light.

* * * * *